United States Patent [19]
Palara et al.

[11] Patent Number: 4,623,950
[45] Date of Patent: Nov. 18, 1986

[54] PROTECTIVE DEVICE FOR A POWER ELEMENT OF AN INTEGRATED CIRCUIT

[75] Inventors: Sergio Palara, Bareggio; Aldo Torazzina, Monza, both of Italy

[73] Assignee: SGS-ATES Componenti Elettronici SpA, Milan, Italy

[21] Appl. No.: 574,964

[22] Filed: Jan. 30, 1984

[30] Foreign Application Priority Data

Jan. 31, 1983 [IT] Italy .............................. 19341 A/83

[51] Int. Cl.[4] .............................................. H02H 3/42
[52] U.S. Cl. ........................................ 361/79; 361/88; 361/93
[58] Field of Search ...................... 361/79, 87, 88, 91, 361/93; 323/278

[56] References Cited

U.S. PATENT DOCUMENTS 3,792,316 2/1974 Bondini et al. ....................... 361/79
4,074,334 2/1978 D'Arrigo et al. ..................... 361/79

Primary Examiner—A. D. Pellinen
Assistant Examiner—H. L. Williams
Attorney, Agent, or Firm—Wenderoth, Lind & Ponack

[57] ABSTRACT

A protective device for a power element of an integrated circuit includes a circuit element for detecting and processing the value of the current flowing through the power element and the voltage supplied to the power element. The circuit element generates a measuring signal which, when it reaches a predetermined limit value, activates a threshold circuit which reduces the current level in the power element. The protective device also includes a circuit element for amplifying the measuring signal when it reaches the predetermined limit value.

4 Claims, 2 Drawing Figures

PROTECTIVE DEVICE FOR A POWER ELEMENT OF AN INTEGRATED CIRCUIT

BACKGROUND OF THE INVENTION

The present invention relates to protective devices for power elements included in integrated circuits, and more particularly, to devices for protection against overcurrents and overvoltages at the output as a result, for example, of a short circuit, in final power transistors included in monolithically integrated amplifier circuits.

Such protective devices are integrated together with the circuit including the power element to be protected. Therefore, their fabrication must be simple and economical and, above all, they must not cause power losses that would limit the dynamic operation of the power element.

In addition, they must have a high degree of reliability to ensure protection.

A type of protective device of the prior art that satisfies such requirements has a circuit diagram comprising at least one active element which is thermally coupled to the power element to be protected, said active element being connected to a control circuit element which provides for the turn-off of the integrated circuit with which said power element is associated when the active element detects a dangerous temperature level, which is an indication of an excessive power dissipation under overvoltage or overcurrent conditions.

However, this type of protection, however efficient and reliable, is unsuitable when the abnormal operating conditions are only transitory, because in every case, the device remains turned off without outside intervention.

Therefore, even if more complicated from the circuit point of view, protective devices with an operating threshold which is not related to the level of thermal dissipation but is rather related to the level of the electrical magnitudes, i.e.—current and voltage, relative to the element to be protected, are more commonly employed. On the basis of their levels, such magnitudes can be properly adjusted without the necessity of turning off the integrated circuit.

Such protective devices usually include circuit elements for the detection and processing of the value of the current flowing through the power element and the voltage supplied to the power element in order to effect above, the activation of a threshold circuit so as to reduce the value of the current flowing through the power element to a maximum value corresponding to a predetermined threshold level as a function of the value of the voltage supplied to the power element.

The circuit diagram of this type of protective device, normally employed in monolithically integrated amplifier circuits, is illustrated in FIG. 1 of the drawings. It protects a final bipolar power transistor of the NPN type denoted in the figure by the symbol $T_1$ and pertaining to an integrated circuit not shown in detail in the figure.

The emitter of the transistor $T_1$ is connected to an output terminal U for the connection to the load by means of an electrical conductor having a distributed resistance with an accurately determined overall valve $R_1$. By way of example, this may be physically realized by means of a gold wire having dimensions with extremely close tolerances.

For greater clarity, the overall resistance $R_1$ of such a conductor is shown in the figure as a lumped resistance.

The collector of transistor $T_1$ is connected to the positive terminal $+Vcc$ of a supply voltage source and the base of the transistor $T_1$ is connected to the emitter of a second bipolar transistor $T_2$ of the NPN type whose collector is also connected to the positive terminal $+Vcc$.

The current signal whose power is to be amplified is supplied to an input terminal IN connected to the base of transistor $T_2$ which controls transistor $T_1$.

The emitter of transistor $T_1$ is likewise connected, through a diode $D_1$, to the base of a bipolar transistor $T_3$ of the NPN type, whose emitter is also connected to the output terminal U through an electrical conductor having a distributed resistance $R_2$ of a much smaller value designated in the figure as being a lumped resistance for greater clarity.

The base of transistor $T_3$ is connected to the positive terminal $+Vcc$ through a biasing resistor $R_3$.

The collector of transistor $T_3$ is connected to the base of a bipolar transistor $T_5$ of the PNP type, which is also connected to the positive terminal $+Vcc$ through a constant current generator $A_1$.

The emitter and collector of transistor $T_5$ are respectively connected to the input terminal IN and the negative terminal $-Vcc$ of the supply voltage source.

Diode $D_1$, transistor $T_3$, and resistor $R_3$ perform the function of processing the current flowing through resistor $R_1$ and the voltage between the collector and the emitter of the final power transistor $T_1$.

Any increase in the voltage or the output current of transistor $T_1$ results in an increase in the base current and, thereby, in the collector current of transistor $T_3$. Transistor $T_5$ and constant current generator $A_1$ together form a threshold circuit. Until the value of the collector current of transistor $T_3$ drops below the value of the constant current generated by constant current generator $A_1$, transistor $T_5$ is inoperative and the signal current supplied to the input IN is amplified without modification and transferred to the output U, but—due to an excessive increase in the voltage or current at the output of transistor $T_1$—as soon as the current flowing through the collector of transistor $T_3$ exceeds the value of the reference current generated by constant current generator $A_1$, transistor $T_5$ starts to conduct.

The transistor $T_5$ is controlled by the current resulting from the differential between the reference current and the collector current of transistor $T_3$ and, thus, a part of the signal current present at the input IN is absorbed by transistor $T_5$. Therefore, transistor $T_1$, being controlled by a lower current, reduces its level of conduction relative to the voltage supplied thereto to the value by which the collector current of transistor $T_3$ is reduced to the limit of the current generated by constant current generator $A_1$.

Thus, the output current does not exceed, in relation to the voltage supplied to transistor $T_1$, the automatically checked maximum value determining the operation of the protection circuit.

The protective circuit described hereinabove is designed in such a way that said relationship between the current flowing through the final power transistor and the voltage supplied thereto, depending on the supply and on the load conditions, is of the exponential type, as can easily be determined by analytical means due to the presence of a diode in the circuit for processing the magnitudes under control.

By appropriately choosing the value of the circuit components, said relationship can be represented on the plane which is characteristic of the power transistor with a curve which approaches, in part, the curve of the maximum power that can be dissipated by the transistor and, in part, by that of the secondary breakdown of the transistor, but remaining at every point below said curves.

It is well known that the curve of the maximum power that can be dissipated is a branch of a hyperbole having as asymptotes the coordinated axes of the characteristic plane, that is to say, a curve which is a locus of the points in which $$V \times I = \text{constant},$$

while the secondary breakdown curve has a typical shape for any type of power transistor.

It will be understood that by appropriately designing the protective circuit, only one diagram of which is indicated by way of illustrative example, those skilled in the art can arrive at the relationship on the characteristic plane which is more suited to the type of final transistor and to the type of application.

In the event of a short circuit at the output, the collector-emitter biasing voltage, without negligible voltage drops across the resistive elements of the circuit, equals the supply voltage, even if during a brief initial transient, the voltage across the transistor may exceed the supply voltage for inductive loads.

Therefore, following such a possible transient, the maximum electrical power in the transistor equals the product of the supply voltage and the maximum current therein allowed by the protective circuit in relation to the value of such a voltage.

The maximum allowable value of the current that can flow through the power transistor, on which depends the circuit values of the protective circuit, is determined by the physical characteristics.

In general, for reasons of economy, users of integrated circuits including power elements determine the values of the external dissipator elements through the heat developed by such elements according to the requirements of normal operating conditions, because brief periods of high heat dissipation are well tolerated.

However, prolonged short circuits are dangerous, because they may damage the integrated circuit or may cause the surrounding material to overheat and burn as a result of the heat developed which is insufficiently dissipated to the outside.

On the other hand, it is inconvenient to reduce the maximum current level in the power element by lowering the operating threshold of the protection, because this would unnecessarily limit the dynamic performance of the circuit under normal operating conditions.

SUMMARY OF THE INVENTION

The primary object of the present invention is to provide a protective device for a power element of an integrated circuit which, compared to the protective devices of the prior art—even during protracted overcurrent and overvoltage conditions—ensures a high degree of reliability without any loss of useful power, and permits a safer utilization of the integrated circuit itself.

This object is achieved by making use of the protective device as defined and characterized in the appended claims.

For example, this object may be achieved by providing a protective device for a power element of an integrated circuit, said protective device integrated in said integrated circuit and comprising a circuit means for detecting and processing the value of a current flowing through said power element and a voltage across said power element and for generating a measuring signal in response thereto, and a threshold circuit means which is connected to said circuit means and is activated by said measuring signal when said signal reaches a prespecified limit value and which, after having been activated, generates a control signal for reducing said value of said current flowing through said power element, wherein said threshold circuit means comprises a means for amplifying said measuring signal when said measuring signal reaches said prespecified limit value.

BRIEF DESCRIPTION OF THE DRAWINGS

The invention will be better understood from a consideration of the following detailed description given solely way of illustrative non-limitative example, with reference to the accompanying drawings, in which.

Like reference numbers designate like parts throughout the several figures.

DESCRIPTION OF THE PREFERRED EMBODIMENT

Figure 1:
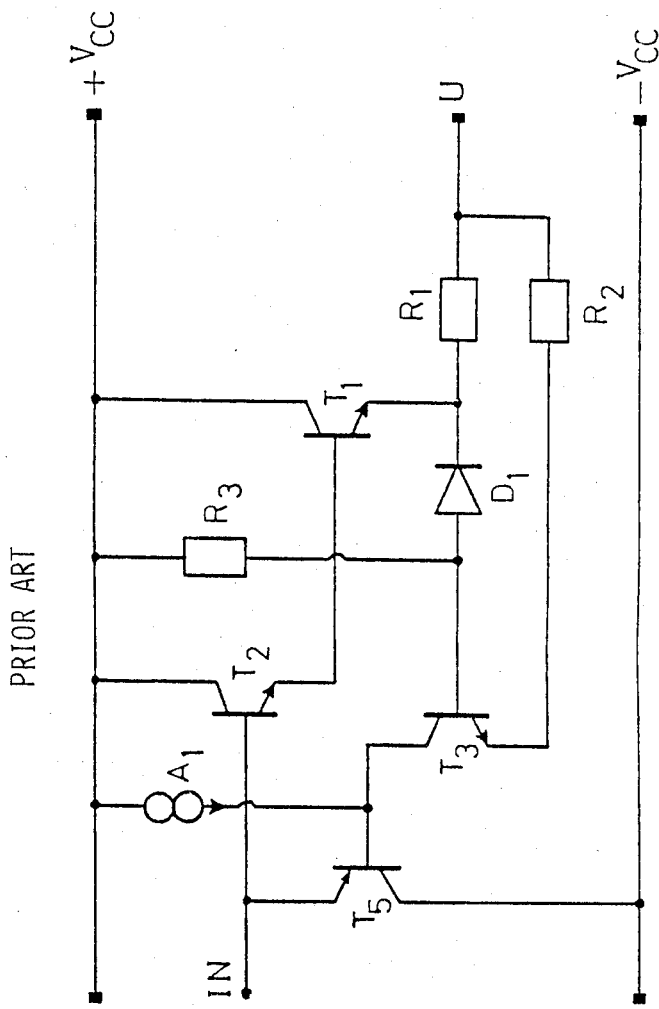
FIG. 1 is a circuit diagram of the protective device for a power element of an integrated circuit as known from the prior art.
Figure 2:
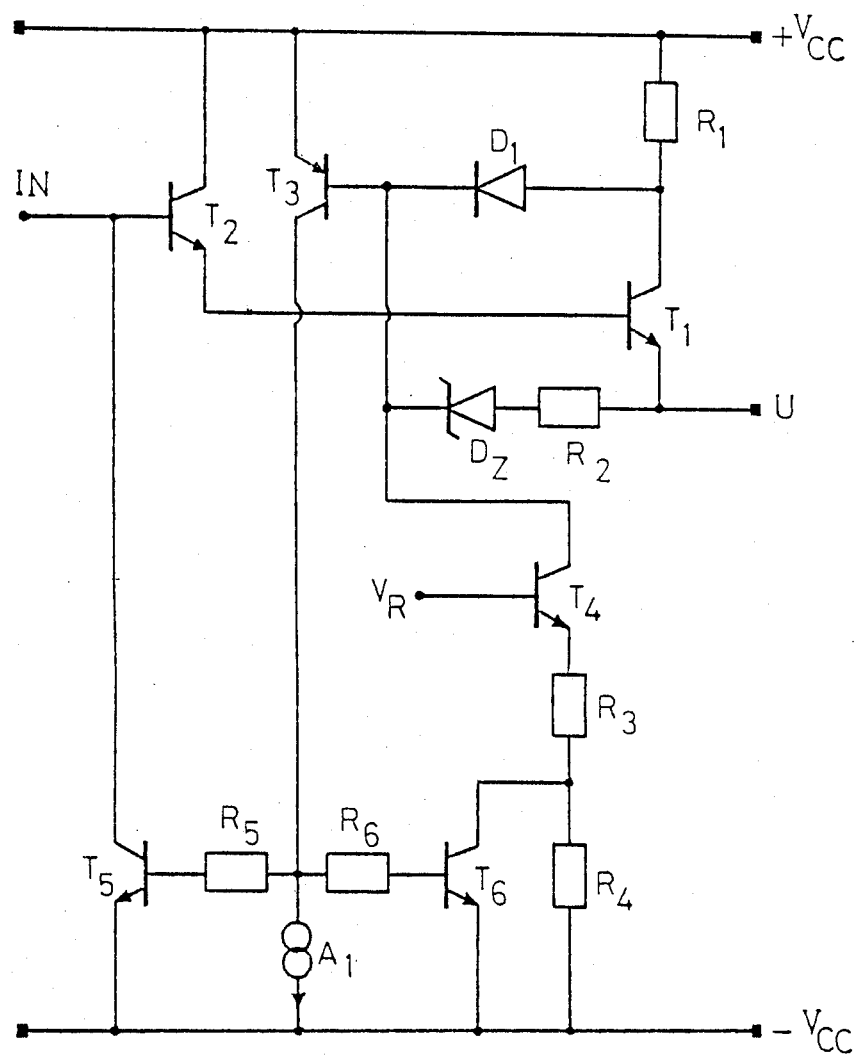
FIG. 2 is a circuit diagram of a protective device embodying the principles of the invention.

The circuit diagram depicted in FIG. 2 comprises a bipolar transistor $T_1$ of the NPN type constituting the final power element of a monolithically integrated amplifier circuit. The emitter of a second bipolar transistor $T_2$ of the NPN type is connected to the base of transistor $T_1$.

The base of the transistor $T_2$ is connected to an input terminal IN. A signal current is fed to terminal IN and is transmitted via transistor $T_2$ so as to control the conduction of transistor $T_1$. The collector of transistor $T_2$ is connected to the positive terminal $+V_{cc}$ of a supply voltage source.

The collector of transistor $T_1$ is connected to the positive terminal $+V_{cc}$ through a resistor $R_1$ and to the anode of a diode $D_1$. The emitter is connected to an output terminal U, to which can be connected an external load, and to the anode of a Zener diode $D_Z$ by means of a resistor $R_2$.

The cathodes of diode $D_1$ and Zener diode $D_Z$ are both connected to the base of a third bipolar transistor $T_3$ of the PNP type, and to the collector of a fourth bipolar transistor $T_4$ of the NPN type.

The base of transistor $T_4$ is connected to a voltage reference $V_R$ (which, in particular, is twice the normal base-emitter voltage of an NPN transistor) and its emitter is connected to the negative terminal $-V_{cc}$ of the supply voltage source by means of two series resistors $R_3$ and $R_4$.

The emitter of transistor $T_3$ is connected to positive terminal $+V_{cc}$, while its collector is connected to the negative terminal $-V_{cc}$ by means of a constant current generator $A_1$, and to the bases of a fifth transistor $T_5$, and a sixth bipolar transistor $T_6$, both of the NPN type, respectively through a resistor $R_5$ and a resistor $R_6$.

The emitter and collector of transistor $T_5$ are respectively connected to the negative terminal $-V_{cc}$ and to the input terminal IN. The emitter and the collector of transistor $T_6$ are respectively connected to the negative terminal $-Vcc$ and to the point connecting the two series resistors $R_3$ and $R_4$.

The current flowing through resistor $R_1$ equals the sum of the current $I_D$ flowing through diode $D_1$ and the collector current $I_C$ of the final power transistor $T_1$. As a result of a value of the collector-emitter voltage $V_{CE1}$ of transistor $T_1$, which is not sufficiently high to enable Zener diode $D_Z$ to conduct, the current $I_D$ equals the collector current of transistor $T_4$, without the negligible current of the base of transistor $T_3$.

Because the base of transistor $T_4$ is kept at a fixed potential in relation to the negative terminal $-Vcc$, the fixed potential being equal to twice the base-emitter voltage $V_{BE}$ of a normal NPN transistor, this produces:

$$I_D = \frac{V_{BE}}{R_3 + R_4} \tag{1}$$

By contrast, as a result of the value of the collector-emitter voltage of transistor $T_1$ being such as to permit the conduction of diode $D_Z$, without the negligible base current of $T_3$, this produces:

$$I_D = \frac{V_{BE}}{R_3 + R_4} + \frac{V_{CE1} - V_D - V_Z}{R_2} \tag{2}$$

where $V_D$ and $V_Z$ respectively stand for the voltages of the junction boundaries between diode $D_1$ and diode $D_Z$.

Between the collector current $I_3$ of transistor $T_3$ and the collector current $I_D$ flowing through diode $D_1$ obtained by connecting the collector of a normal transistor to its base, one obtains the following relationship:

$$V_{BE3} - V_D = \frac{KT}{q} \ln \frac{I_3 A_D}{I_D A_3} \tag{3}$$

where $V_{BE3}$ stands for the base-emitter voltage of transistor $T_3$ and $A_3$ and $A_D$ are, respectively, the emitter regions of transistor $T_3$ and of the transistor that has its base short-circuited to the collector constituting the diode $D_1$ and produced by conventional integration techniques.

K and T are, respectively, the Boltzmann constant and the absolute junction temperature, and q is the electron charge.

Because:

$$V_{BE3} - V_D = V_{R1} = R_1 \cdot I_C + R_1 \cdot I_D$$

it follows that increments of the current $I_C$ in the power element $T_1$ determine, according to the abovenoted equation (3), corresponding increments of the current of collector $I_3$ of transistor $T_3$, but also as a function of the voltage $V_{CE1}$ supplied to the element $T_1$ according to equations (1) and (2).

As long as the value of the current $I_3$ does not exceed that of the current $I_T$ imposed by the current generator $A_1$, transistors $T_5$ and $T_6$ cannot conduct, since they are not supplied with base currents.

Transistors $T_5$ and $T_6$ and their base resistors $R_5$ and $R_6$ are selected so that as soon as the value of $I_3$ is greater than that of $I_T$, transistor $T_6$, first, starts immediately to operate at saturation, immediately followed by transistor $T_5$ which, however, conducts while remaining in the active region of its operating range.

Because a saturated transistor is virtually a short circuit between collector and emitter, resistor $R_4$ is short-circuited and, hence, the possible current levels $I_D$ increase to the following respective values:

$$I_D = \frac{V_{BE}}{R_3} \text{ and } I_D = \frac{V_{BE}}{R_3} + \frac{V_{CE1} - V_D - V_Z}{R_2}$$

for such values of the voltage $V_{CE1}$ as to keep the Zener diode inoperative, and for such values of the voltage $V_{CE1}$ as to permit the conduction thereof.

The resulting current increase is thus determined by the value of resistor $R_4$, which can be appropriately selected. This causes an increase in the voltage drop across resistor $R_1$ and, hence, since $$V_{R1} = V_{BE3} - V_D = \frac{KT}{q} \ln \frac{I_3 A_D}{I_D A_3} \tag{4}$$

the current flowing through collector $I_3$ transistor $T_3$ is also increased by a predetermined quantity.

Therefore, transistor $T_5$, which starts to conduct immediately after transistor $T_6$ when $I_3$ exceeds the threshold current $I_T$, is immediately driven to a high level of conduction, $I_3$ being suddenly switched beyond the value of the threshold current.

In this case, transistor $T_5$, whose collector is connected to the input IN, absorbs a considerable part of the signal current at the input.

Therefore, the resultant control current which, through transistor $T_2$, controls the conduction of transistor $T_1$, is lower than the current in the protective circuit of known construction described hereinabove when the protection circuit of the present invention and the protection circuit of known construction are both operating at the same level of operating thresholds. Accordingly, the current level in the power element after the intervention of the protection circuitry is also correspondingly lower than that of the prior art.

The mathematical relationship between the value of the voltage $V_{CE1}$ across the power element $T_1$ imposed by the load, due to the current supplied and due to the voltage drops across the resistive elements of the circuit in series with the power element, and the value of the maximum current capable of flowing through the power element corresponding to such a voltage when the latter is protected by the protective circuitry described hereinabove, can easily be obtained by using the equations (1), (2), (3) and (4), in view of the fact that the circuit is so designed that the current $I_D$ is always negligible with respect to $I_C$ and, hence, $V_{R1} \cong R_1 I_C$. Since the protection circuitry operates only for $I_3$ values greater than the threshold current $I_T$, the maximum current flows through transistor $T_1$ when $I_3 = I_T$.

Therefore, the voltage versus maximum current relationship turns out to be:

$$I_{C\,MAX} = \frac{KT}{qR_1} \ln \left( \frac{A_D}{A_3} \cdot \frac{I_T}{V_{BE}/(R_3 + R_4)} \right) = \tag{5}$$

constant for $V_{CE1} = V_B + V_Z$, and $$I_{C\,MAX} = \frac{KT}{qR_1} \ln\left( \frac{A_D}{A_3} \cdot \frac{I_T}{V_{BE}/(R_3+R_4) + (V_{CE1} - V_D - V_Z)/R_2} \right) \quad (6)$$

for $V_{CE1} \geq V_D + V_Z$, in which the value of the maximum current decreases logarithmically as the voltage $V_{CE1}$ increases. If for any reason whatever, e.g., a short circuit, the current $I_C$ exceeds the maximum value, then the value of $I_3$ exceeds the value of the threshold $I_T$, thereby causing the protection circuitry to be operative throughout the period during which the cause of the overcurrent exists and to keep $I_C$ at a level which is lower than the maximum level, or at the value:

$$I_C = \frac{KT}{qR_1} \ln\left( \frac{A_D}{A_3} \cdot \frac{I_T}{V_{BE}/R_3} \right) = \text{constant} \quad (7)$$

for $V_{CE1} < V_D + V_Z$ and at the value:

$$I_C = \frac{KT}{qR_1} \ln\left( \frac{A_D}{A_3} \cdot \frac{I_T}{V_{BE}/R_3 + (V_{CE1} - V_D - V_Z)/R_2} \right)$$

for $V_{CE1} \geq V_D + V_Z$. On the plane which is characteristic of the final power transistor, the two preceding equations (5) and (6), which show the relationships between the possible collector-emitter voltage values and the corresponding maximum current values, can be represented by a single curve which also approaches the "curve of maximum dissipated power", and on the basis of which an effective protection would already be ensured so as to be at least equal to that protection supplied by the protective devices of the prior art for overvoltage or overcurrent conditions during non-protracted periods of time.

However, a characteristic feature of the protective device according to the present invention is the possibility of causing the final transistor to enter into operation as soon as the voltage supplied thereto has activated the protection circuitry according to a curve representing the equations (7) and (8) on a characteristic plane which is substantially parallel to the preceding one but more on the inside of the "curve of maximum dissipated power", so that even short circuit conditions that are unlimited in time can be sustained in all safety and without any damage using external dissipators designed exclusively for normal operation.

As is apparent from the foregoing, a protective device in accordance with the present invention and such as described hereinabove, in addition to the circuit elements for detecting and processing the electrical magnitudes relative to the power element to be protected and in addition to the threshold circuit for activating the protection circuitry only when the measuring signal supplied by said circuit elements reaches a prespecified level, also comprises circuit elements capable of amplifying said measuring signal as soon as the latter has reached the threshold value. Thus, for as long as the abnormal conditions persist, the current flowing through the power element remains at a constant level which is lower than the current level which has caused the activation of the protection circuitry by a predetermined amount.

While only one particular embodiment of the invention has been shown, it will be understood that the invention is not limited thereto, since many modifications may be made and it is, therefore, contemplated to cover by the appended claims any such modifications as fall within the true spirit and scope of the invention.

For example, apart from the circuit elements capable of amplifying the measuring signal or in substitution thereof, a protective device embodying the principles of the invention may also comprise circuit elements capable of lowering the prespecified level of the threshold as soon as the measuring signal reaches the same.

We claim:

1. A protective device for a power element of an integrated circuit, said protective device integrated in said integrated circuit and comprising a circuit means for detecting and processing the value of a current flowing through said power element and a voltage across said power element and for generating a measuring signal in response thereto, and a threshold circuit means which is connected to said circuit means and is activated by said measuring signal when said signal reaches a prespecified limit value and which, after having been activated, generates a control signal for reducing said value of said current flowing through said power element, wherein said threshold circuit means comprises a means for amplifying said measuring signal when said measuring signal reaches said prespecified limit value and wherein said current flowing through said power element after activation of said threshold circuit is lower than said prespecified limit value;

wherein said power element comprises a final power transistor of an integrated amplifier circuit, said transistor having a first type of conductivity and having a first terminal, a second terminal and a control terminal, said control terminal being coupled through a control transistor to an input terminal for receiving a signal to be amplified; and wherein said detecting and processing circuit means comprises a first diode, a first terminal of which is connected to said second terminal of said final power transistor and to a first terminal of a supply voltage source through a first resistor, and further comprises a second diode of a Zener type, a first terminal of which is connected through a second resistor to said first terminal of said final power transistor, said first terminal of said final transistor being an output terminal of said amplifier circuit, and further comprises a third transistor and a fourth transistor respectively having a conductivity of a second type which is opposite to said first type of conductivity, and a conductivity of said first type, said third and fourth transistors each having a first and a second terminal and a control terminal, said control terminal of said third transistor and said second terminal of said fourth transistor being both connected to a second terminal of said first diode and a second terminal of said second diode, said first terminal of said third transistor and said first terminal of said fourth transistor being respectively connected to said first terminal of said supply voltage source and, through a resistive element, to a second terminal of said supply voltage source, said control terminal of said fourth transistor being connected to a constant voltage reference source; and wherein said threshold circuit means comprises a fifth transistor, having a conductivity of said first type and having a first terminal, a second terminal and a control terminal, and a constant current source, said second terminal of said third transistor being connected to said second terminal of said supply voltage source through said constant current source and to said control terminal of said fifth transistor through a fourth resistor, said first terminal and said second terminal of said fifth transistor being respectively connected to said second terminal of said supply voltage source and to said input terminal, wherein said means for amplifying said measuring signal comprises a sixth transistor, having a conductivity of said first type and having a first terminal, a second terminal and a control terminal, said control terminal being connected through a fifth resistor to said second terminal of said third transistor, said first terminal of said sixth transistor being connected to said second terminal of said supply voltage source;

wherein said resistive element comprises two resistors connected in series and a junction point between said resistors is connected to said second terminal of said sixth transistor.

2. A protective device as set forth in claim 1, wherein all of said transistors are bipolar transistors, said first terminal, said control terminal and said second terminal of each respectively being an emitter, a base and a collector thereof, and wherein said first and second terminals of each of said diodes are respectively an anode and a cathode thereof.

3. A protective device for a power element of an integrated circuit, said protective device integrated in said integrated circuit and comprising a circuit means for detecting and processing the value of a current flowing through said power element and a voltage across said power element and for generating a measuring signal in response thereto, and a threshold circuit means which is connected to said circuit means and is activated by said measuring signal when said signal reaches a prespecified limit value and which, after having been activated, generates a control signal for reducing said value of said current flowing through said power element, wherein said threshold circuit means comprises a means for amplifying said measuring signal when said measuring signal reaches said prespecified limit value;

wherein said power element comprises a final power transistor of an integrated amplifier circuit, said transistor having a first type of conductivity and having a first terminal, a second terminal and a control terminal, said control terminal being coupled through a control transistor to an input terminal for receiving a signal to be amplified; and wherein said detecting and processing circuit means comprises a first diode, a first terminal of which is connected to said second terminal of said final power transistor and to first terminal of a supply voltage source through a first resistor, and further comprises a second diode of the Zener type, a first terminal of which is connected through a second resistor to said first terminal of said final power transistor, said first terminal of said final transistor being an output terminal of said amplifier circuit, and further comprises a third transistor and a fourth transistor respectively having a conductivity of a second type which is opposite to said first type of conductivity, and a conductivity of said first type, said third and fourth transistors each having a first and a second terminal and a control terminal, said control terminal of said third transistor and said second terminal of said fourth transistor being both connected to a second terminal of said first diode and a second terminal of said second diode, said first terminal of said third transistor and said first terminal of said fourth transistor being respectively connected to said first terminal of said supply voltage source and, through a resistive element, to a second terminal of said supply voltage source, said control terminal of said fourth transistor being connected to a constant voltage reference source; and wherein said threshold circuit means comprises a fifth transistor, having a conductivity of said first type and having a first terminal, a second terminal and a control terminal, and a constant current source, said second terminal of said third transistor being connected to said second terminal of said supply voltage source through said constant current source and to said control terminal of said fifth transistor through a fourth resistor, said first terminal and said second terminal of said fifth transistor being respectively connected to said second terminal of said supply voltage source and to said input terminal, wherein said means for amplifying said measuring signal comprises a sixth transistor, having a conductivity ofsaid first type and having a first terminal, a second terminal and a control terminal, said control terminal being connected through a fifth resistor to said second terminal of said third transistor, said first terminal of said sixth transistor being connected to said second terminal of said supply voltage source;

wherein said resistive element comprises two resistors connected in series and a junction point between said resistors is connected to said second terminal of said sixth transistor.

4. A protective device as set forth in claim 3, wherein all of said transistors are bipolar transistors, said first terminal, said control terminal and said second terminal of each respectively being an emitter, a base and a collector thereof, and wherein said first and second terminals of each of said diodes are respectively an anode and a cathode thereof.

* * * * *